United States Patent
Lam-Leventis et al.

(10) Patent No.: US 7,290,240 B1
(45) Date of Patent: Oct. 30, 2007

(54) LEVERAGING COMBINATIONS OF SYNTHESIS, PLACEMENT AND INCREMENTAL OPTIMIZATIONS

(75) Inventors: Carolyn Lam-Leventis, Toronto (CA); Terry Borer, Toronto (CA); Deshanand Singh, Mississauga (CA)

(73) Assignee: Altera Corporation, San Jose, CA (US)

( * ) Notice: Subject to any disclaimer, the term of this patent is extended or adjusted under 35 U.S.C. 154(b) by 352 days.

(21) Appl. No.: 10/903,252

(22) Filed: Jul. 30, 2004

(51) Int. Cl.
*G06F 17/50* (2006.01)
(52) U.S. Cl. .............................. 716/18; 716/2; 716/16; 716/17
(58) Field of Classification Search .................. 716/16, 716/17, 18, 2, 9, 10
See application file for complete search history.

(56) References Cited

U.S. PATENT DOCUMENTS 5,983,277 A * 11/1999 Heile et al. ................. 709/232
6,298,319 B1 * 10/2001 Heile et al. ................... 703/26
7,076,751 B1 * 7/2006 Nixon et al. ................... 716/5
2003/0149962 A1 * 8/2003 Willis et al. ................ 717/135

* cited by examiner

*Primary Examiner*—Sun James Lin
(74) *Attorney, Agent, or Firm*—Townsend and Townsend and Crew, LLP

(57) ABSTRACT

Multiple optimization phases are combined to improve the performance and decrease the compilation time of user designs. An initial user design is compiled and analyzed to provide timing information. A two-pass optimization phase uses the timing information to optimize the user design. As the compilation process is repeated for the optimized user design, an incremental processing phase applies configuration information previously generated for the original user design to the corresponding portions of the optimized user design. Similarly, a selected one of a set of optimization algorithms can be applied to a modified user design, with the selection determined from an evaluation of the set of optimization algorithms on the unmodified user design. Additionally, external applications can perform one or more optimization phases on an original or modified user design. Using an illegality resolver and/or an incremental processing phase, the external applications' output can be efficiently integrated with other compilation phases.

37 Claims, 9 Drawing Sheets

400

LEVERAGING COMBINATIONS OF SYNTHESIS, PLACEMENT AND INCREMENTAL OPTIMIZATIONS

CROSS-REFERENCES TO RELATED APPLICATIONS

The disclosure of this application is related to the disclosures of U.S. patent application Ser. No 10/679,593 filed Oct. 6, 2003 entitled "Post Placement Shannon's Expansion for Performance Improvement on FPGA's", U.S. patent application Ser. No. 10/617,502 filed Jul. 11, 2003 entitled "Incremental Placement for Layout-Driven Optimizations on FPGA's", and U.S. patent application Ser. No. 10/461,921 filed Jun. 12, 2003 entitled "Physical Resynthesis of a Logic Design" all of which are assigned to the assignee of the present application, the full disclosures of which are incorporated herein by reference in their entirety.

BACKGROUND OF THE INVENTION

The present invention relates to the field of programmable devices, and the systems and methods for programming the same. Programmable devices, such as FPGAs, typically includes thousands of programmable logic cells that use combinations of logic gates and/or look-up tables to perform a logic operation. Programmable devices also include a number of functional blocks having specialized logic devices adapted to a specific logic operations. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

A typical design cycle for determining the configuration of a programmable device, referred to compilation, starts with an extraction phase, followed by a logic synthesis phase, a fitting phase, and an assembly phase. The extraction phase takes a user design, typically expressed as a netlist in a hardware description language such as Verilog or VHDL, and produces a set of logic gates implementing the user design. In the logic synthesis phase, the set of logic gates is permutated over the hardware architecture of the programmable device in order to match elements of the user design with corresponding portions of the programmable device. The fitting phase assigns the various portions of the user design to specific logic cells and functional blocks and determines the configuration of the configurable switching circuit used to route signals between these logic cells and functional blocks, taking care to satisfy the user timing constraints as much as possible. In the assembly phase, a configuration file defining the programmable device configuration is created. The configuration can then be loaded into a programmable device to implement the user design.

To satisfy the requirements of a user design, one or more additional optimization phases can be used to optimize the user design. Optimization phases can optimize a user design with respect to a number of different criteria, including as overall execution speed, programmable device resource consumption (referred to as area), and power consumption. To yield greater performance of the user design as implemented by the programmable device, it is often desirable to process the user design with two or more optimization phases.

However, this approach often leads to difficulties. For example, a first optimization phase may optimize a user design so thoroughly that a second optimization phase does not have sufficient "room" to effectively further optimize the user design. Conversely, a second optimization phase, in the course of attempting to optimize the user design, may undo the optimizations added by a previously executed optimization phase. Additionally, running multiple optimization phases can greatly increase the amount of time required to compile the user design.

As user designs are developed, designers typically invest substantial time and resources to optimize the user design to satisfy a set of design requirements. Designers often need to make small changes to the user design to correct mistakes or satisfy additional requirements. To implement these changes, referred to change orders, the modified user design must be re-compiled. During compilation, the small change in the user design will often cascade into a drastically different compiler output. As a result, the designers often lose many of the optimizations previously to the original user design and must begin anew to re-optimize the modified user design.

It is therefore desirable for a system and method to improve the efficacy of combinations of optimization phases to improve the performance of user designs. It is further desirable to decrease the compilation time required to optimize user designs with combinations of optimization phases. It is also desirable that the optimization of modified versions of a user design does not unnecessarily discard previous optimizations.

BRIEF SUMMARY OF THE INVENTION

An embodiment of the invention combines multiple optimization phases to improve the performance, (for example by increasing the maximum operating speed, decreasing the area requirements, and reducing power consumption), and decrease the compilation time of user designs. An initial user design is compiled and analyzed to provide timing information. A two-pass optimization phase uses the timing information to optimize the user design. As the compilation process is repeated for the optimized user design, an incremental processing phase applies configuration information previously generated for the original user design to the corresponding portions of the optimized user design. Similarly, a selected one of a set of optimization algorithms can be applied to a modified version of the user design, with the selection determined from a previous evaluation of the set of optimization algorithms on the unmodified version of the user design. Additionally, external applications can perform one or more optimization phases on an original or modified user design. Using an illegality resolver and/or an incremental processing phase, the output of the external applications can be efficiently integrated with other compilation phases.

In an embodiment, a method of determining the configuration of a programmable device includes applying a first set of compilation phases to a user design, applying an optimization phase to the user design to create an optimized user design, applying a second set of compilation phases to the optimized user design, and applying an incremental processing phase to the optimized user design. The incremental processing phase is adapted to apply a set of configuration information previously determined in the first set of compilation phases to a corresponding portion of the optimized user design. In a further embodiment, the incremental processing phase further is adapted to generate a new set of configuration information for a non-corresponding portion of the optimized user design.

In an additional embodiment, the incremental processing phase includes an incremental compile phase adapted to apply a set of placement information previously determined for the user design to the corresponding portion of the optimized user design and to generate a new set of placement information for the non-corresponding portion of the optimized user design. In another embodiment, the incremental processing phase includes an incremental routing phase adapted to apply a set of routing information previously determined for the user design to the corresponding portion of the optimized user design and to generate a new set of routing information for the non-corresponding portion of the optimized user design.

In a further embodiment, the second set of compilation phases is a subset of the first set of compilation phases. The first set of compilation phases includes an extraction phase, a synthesis phase, a technology mapper phase, a placement phase, a routing phase, a delay annotation phase, and a timing analyzer phase and the second set of compilation phases includes a synthesis phase, and a technology mapper phase. The optimization phase includes a two-pass optimization phase. In an additional embodiment, the optimization phase is performed by an external software application. An illegality resolver phase adapted to detect and remove illegalities in the optimized user design.

BRIEF DESCRIPTION OF THE DRAWINGS

The invention will be described with reference to the drawings, in which.

In the drawings, the use of like reference numbers in different drawings indicates similar components.

DETAILED DESCRIPTION OF THE INVENTION

Figure 1:
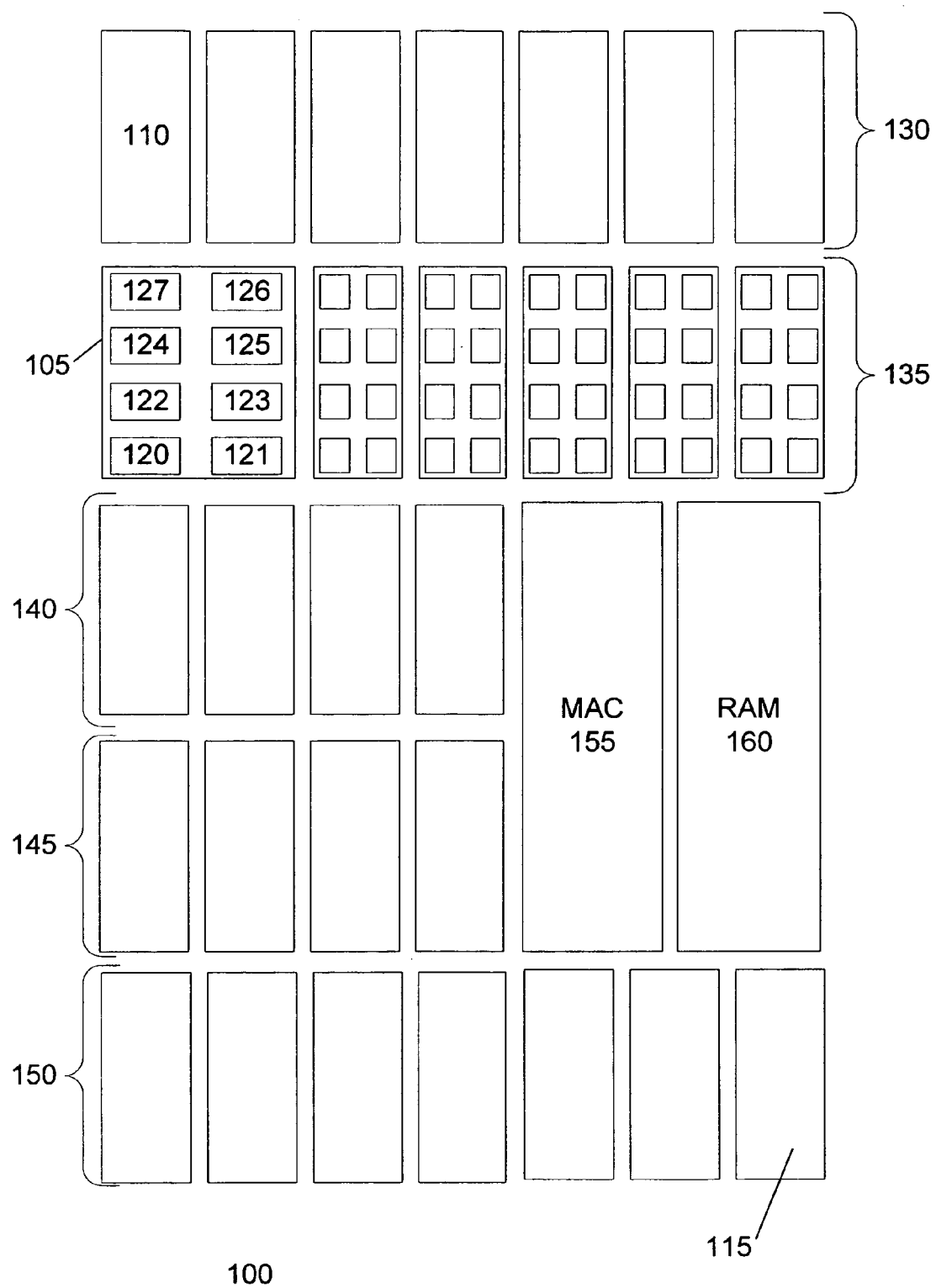
FIG. 1 illustrates a portion of an example programmable device suitable for use with an embodiment of the invention.

FIG. 1 illustrates a portion of an example programmable device 100 suitable for use with an embodiment of the invention. Programmable device 100 includes a number of logic array blocks (LABs), such as LABs 105, 110, 115. Each LAB includes a number of programmable logic cells using logic gates and/or look-up tables to perform a logic operation. LAB 105 illustrates in detail logic cells 120, 121, 122, 123, 124, 125, 126, and 127. Logic cells are omitted from other LABs in FIG. 1 for clarity. The LABs of device 100 are arranged into rows 130, 135, 140, 145, and 150. In an embodiment, the arrangement of logic cells within a LAB and of LABs within rows provides a hierarchical system of configurable connections, in which connections between logic cells within a LAB, between cells in different LABs in the same row, and between cells in LABs in different rows require progressively more resources and operate less efficiently.

In addition to logic cells arranged in LABs, programmable device 100 also includes specialized functional blocks, such as multiply and accumulate block (MAC) 155 and random access memory block (RAM) 160. For clarity, the portion of the programmable device 100 shown in FIG. 1 only includes a small number of logic cells, LABs, and functional blocks. Typical programmable devices will include thousands or tens of thousands of these elements.

Figure 2:
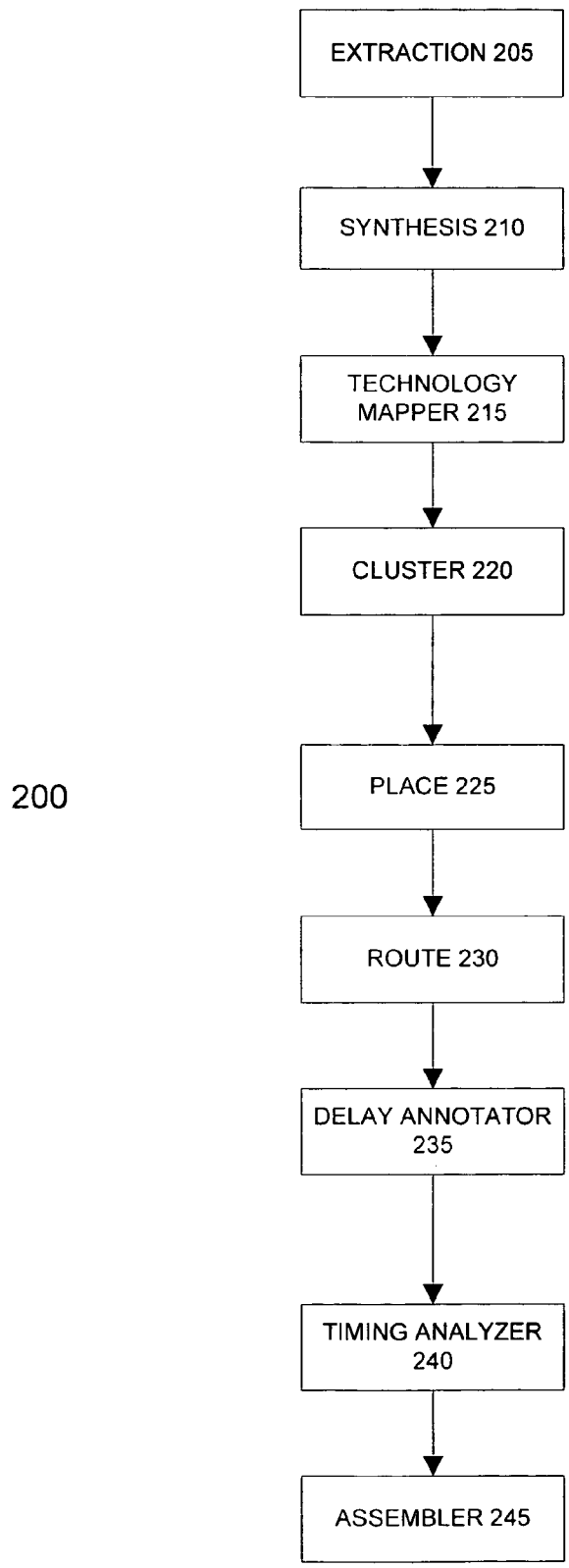
FIG. 2 illustrates the phases of a typical compilation process suitable for implementing an embodiment of the invention.

FIG. 2 illustrates the phases of a typical compilation process 200 suitable for implementing an embodiment of the invention. The compilation process 200 converts a user design into a programmable device configuration adapted to configure a programmable device to implement the user design. The extraction phase 205 converts a description of the user design, expressed for example in a hardware description language, into a register transfer layer description.

Synthesis phase 210 converts the register transfer layer description of the user design into a set of logic gates. Technology mapping phase 215 subdivides the set of logic gates into a set of atoms, which are groups of logic gates matching the capabilities of the logic cells or other functional blocks of the programmable device. A given user design may be converted into any number of different sets of atoms, depending upon the underlying hardware of the programmable device used to implement the user design.

Following the technology mapping phase 215, the cluster phase 220 groups related atoms together into clusters. The place phase 225 assigns clusters of atoms to locations on the programmable device. The route phase 230 determines the configuration of the configurable switching circuit of the programmable device used to connect the atoms implementing the user design.

The delay annotator phase 235 determines the signal delays for the set of atoms and their associated connections in the configurable switching circuit using a timing model of the programmable device. The timing analysis phase 240 determines the maximum operating speed of the programmable device when implementing the user design, for example by determining the portions of the user design have the largest signal delay.

The assembler phase 245 generates a set of configuration information specifying the configuration of the programmable device implementing the user design, including the configuration of each of the logic cells used to implement the user design and the configuration of the configurable switching circuit used to connect the logic cells. The assembler phase 245 can write the configuration information to a configuration file, which can then be used to configure one or more programmable devices to implement instances of the user design.

To improve the performance of the user design as implemented in the programmable device, for example the maximum operating speed, the area required, and/or the power consumed, one or more optimization phases can be added to the compilation process 200. In an embodiment, the optimization phases include an illegality resolver phase, a physical synthesis phase, a two-pass optimization phase, an incremental compile phase, an incremental route phase, and an external incremental flow phase. The integration of one or more of these optimization phases with the typical compilation process will be discussed in greater detail below.

In an embodiment, an illegality resolver evaluates the proposed placement and/or routing of the atoms of the user design on the programmable device to determine if there are any illegalities. Examples of illegalities include too many atoms placed the same area of the programmable device and multiple signals routed through the same connection of the configurable switching circuit of the programmable device. Upon detecting illegalities, the illegality resolver modifies the proposed placement and/or routing of atoms to remove the illegalities, for example by moving atoms to less populated areas of the programmable device or re-routing connections through different portions of the configurable switching circuit.

In an embodiment, the physical synthesis phase uses timing estimates generated by the place phase to optimize the synthesis of the user design to reduce signal delay and increase the maximum operating speed of the user design implemented on the programmable device. In an embodiment, the physical synthesis phase uses multiple restructuring algorithms to add new atoms or to duplicate existing atoms in locations on the programmable device to minimize signal delay.

There are numerous types of restructuring algorithms that can be applied to the user design by the physical synthesis phase. For example, one type of restructing algorithm improves the maximum frequency at which a user design can operate by moving registers throughout the circuit to reduce the lengths of very long signal paths at the expense of increasing the lengths of shorter signal paths. In one embodiment, the timing-critical signal paths of a user design are identified. Registers having an input connected to a timing-critical signal path are moved backwards along the signal path to an input of a look up table. Registers having an output connected to a timing-critical signal path are moved forward along the signal path to an output of a look up table. If illegalities in placement exist, non-critical components are shifted in order to satisfy preferred locations and produce a legal placement.

In another example of a restructuring algorithm, the critical sinks of a user design are identified and alternative decompositions of the user design logic are examined for potential delay improvements after the placement of components in the user design. In an embodiment, pairs of logic elements on a timing-critical signal path are examined for ways in which they may be re-synthesized to reduce the length of the timing-critical path. The placement information of the user design is then modified to use the best decompositions found. If illegalities in placement exist, non-critical components are shifted in order to satisfy the preferred locations and produce a legal placement.

Because many of these restructuring algorithms are mutually exclusive, an embodiment of the physical synthesis phase applies each restructuring algorithm to the user design and selects the restructuring algorithm that provides the most improvement for a given user design. In a further embodiment, the physical synthesis phase can potentially introduce illegalities to the user design; thus, in an embodiment, the illegality resolver phase is applied to the user design following the completion of the physical synthesis phase to remove any illegalities.

In an embodiment, the two pass optimization phase also resynthesizes the user design using timing information created by a previous phase, such as a timing analyzer phase. This embodiment of the two pass optimization phase uses the timing information to classify each of the original set of atoms of the user design as being part of timing-critical signal paths or a non-critical signal paths. For atoms on timing-critical paths, the two pass optimization phase resynthesizes these atoms to optimize for maximum operating speed. For atoms on a non-critical signal paths, the two pass optimization phase resynthesizes the atoms to minimize the area required to implement the user design.

In an embodiment, the incremental compile phase uses the results of a previous iteration of the compilation process. For example, designers often need to make small changes to the user design to correct mistakes or satisfy additional requirements. To implement these changes, referred to change orders, the modified user design must be re-compiled. In this example, the incremental compile phase uses the results of the compilation phase of a user design in its initial form to improve the compilation of the modified form of the user design. In an embodiment, the incremental compile phase matches atoms from the compilation of the initial user design with corresponding atoms in the modified user design. The incremental compile phase places matching atoms of the modified user design in the same locations as determined in the previous compilation of the initial user design. The incremental compile phase then places the newly-added atoms of the modified user design within the remaining portion of the programmable device. Because the incremental compile phase may potentially assign atoms to illegal locations, in an embodiment, the illegality resolver phase discussed above is used after to the incremental compile phase to remove any illegalities. The incremental compile phase can improve both the results of the compilation process, for example by preserving optimizations made to the initial form of the user design, and decrease the time required by the compilation process.

In an embodiment, the incremental routing phase operates in a similar manner to the incremental compile phase, with the routing configuration used to connect atoms in an initial form of the user design being reused when possible to connect corresponding atoms in the modified user design. After determining the placement and routing of atoms matching the initial user design, the incremental routing phase places newly added atoms within the remaining portion of the programmable device and routes connections for the added atoms using the unused connections of the configurable switching circuit. Because the incremental route phase may potentially assign atoms to illegal locations, in an embodiment, the illegality resolver phase discussed above is used after to the incremental route phase to remove any illegalities. The incremental routing phase can improve both the results of the compilation process, for example by preserving optimizations made to the initial form of the user design, and decrease the time required by the compilation process.

In an embodiment, an external optimization flow phase operates in a similar manner as physical synthesis. The external optimization flow phase can be performed by a software application, for example a third-party optimization software application, separate from the primary software application or applications performing the other phases of the compilation process. The external optimization flow phase allows a designer to use an external application to optimize the user design. The external application modifies the user design and updates the description of the atoms of the user design to reflect these modifications. The atoms of the modified user design are then read by the primary software application to complete the remainder of the compilation process.

In an embodiment, an external extraction and synthesis flow phase operates in a similar manner as extraction and synthesis phases. The external extraction and synthesis flow phase can be performed by a software application, for example a third-party optimization software application, separate from the primary software application or applications performing the other phases of the compilation process. The external extraction and synthesis flow phase allows a designer to use an external application to extract and synthesize the user design. The external application modifies the user design and updates the description of the atoms of the user design to reflect these modifications. The atoms of the modified user design are then read by the primary software application to complete the remainder of the compilation process.

In an embodiment, an external incremental flow phase operates in a similar manner as the incremental compile and route phases. The external incremental flow phase can be performed by a software application, for example a third-party optimization software application, separate from the primary software application or applications performing the other phases of the compilation process. The external incremental flow phase allows a designer to use an external application to change a portion of the user design. The designer passes a parameter to the external application specifying that the user design should be incrementally changed. The external application modifies the user design and incrementally updates the description of the atoms of the user design to reflect these modifications. The atoms of the modified user design are then read by the primary software application to complete the remainder of the compilation process.

Figure 3:
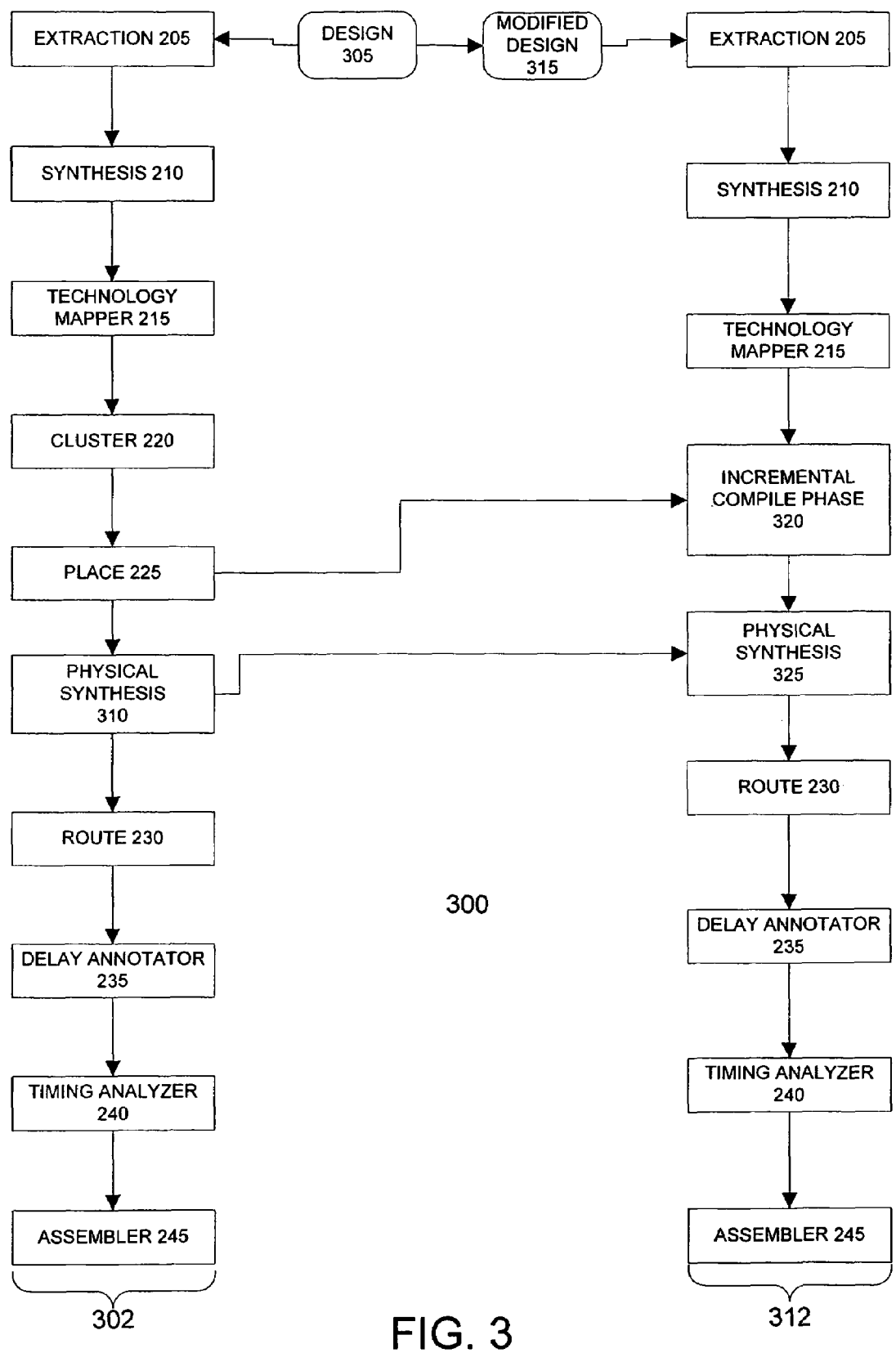
FIG. 3 illustrates an improved compilation process suitable for compiling modified user designs according to an embodiment of the invention.

FIG. 3 illustrates an improved compilation process 300 suitable for compiling modified user designs according to an embodiment of the invention. The compilation process receives an initial user design 305. The initial user design is processed by compilation flow 302, which includes extraction 205, synthesis 210, technology mapper 215, cluster 220, place 225, route 230, delay annotator 235, timing analyzer 240, and assembler 245 phases, as discussed above. In this embodiment, the user design is optimized by the physical synthesis phase 310. As discussed above, the physical synthesis phase 310 tries to optimize the user design using a number of different restructuring algorithms. The physical synthesis phase 310 evaluates the result of the application of each restructuring algorithm and selects the optimization that provides the most improvement for a given user design.

The physical synthesis phase 310 also stores the selection of the restructuring algorithm that provided the best optimization of the given user design. The physical synthesis phase 310 is performed after the place phase 225 and before the route phase 230. As discussed in detail below, the placement of atoms of the user design determined in place phase 225 and the selection of the optimal restructuring algorithm in physical synthesis phase 310 are saved to be used to optimize the compilation of a modified user design.

Following the initial compilation of the user design 305 with compilation flow 302, designers can modify the user design to correct mistakes or satisfy additional requirements. To implement these changes, referred to change orders, the modified user design 315 must be re-compiled. In an embodiment, compilation flow 312 compiles the modified user design 315 to preserve optimizations made to the initial form of the user design and decrease the time required by the compilation process.

Compilation flow 312 includes extraction 205, synthesis 210, technology mapper 215, route 230, delay annotator 235, timing analyzer 240, and assembler 245 phases, as discussed above. Following the technology mapper phase 215 in compilation flow 312, the incremental compile phase 320 matches atoms of the user design 305, which were previously determined in compilation flow 302, with corresponding atoms in the modified user design 315, determined in compilation flow 312. As discussed above, the incremental compile phase 320 places matching atoms of the modified user design 315 in the same locations as determined by the place phase 225 of compilation flow 302, using the placement information saved from the place phase 225 of compilation flow 302. The incremental compile phase 320 then places the newly-added atoms of the modified user design 315 within the remaining portion of the programmable device.

Following the incremental compile phase 325, the physical synthesis phase 325 optimizes the modified user design 315. Rather than apply multiple restructuring algorithms to determine the best optimization of the user design, as done by physical synthesis phase 310, an embodiment of physical synthesis phase 325 applies the restructuring algorithm previously selected by physical synthesis phase 310 to the modified user design 315 and does not evaluate any of the other restructuring algorithms for the modified user design 325. As a result, the physical synthesis phase 325 preserves the previous optimizations of the initial design 305 for the modified user design 315. Additionally, this embodiment of the physical synthesis phase 325 can be executed much faster, as it does not need to apply each of the multiple restructuring algorithms to the modified user design 315.

Figure 4:
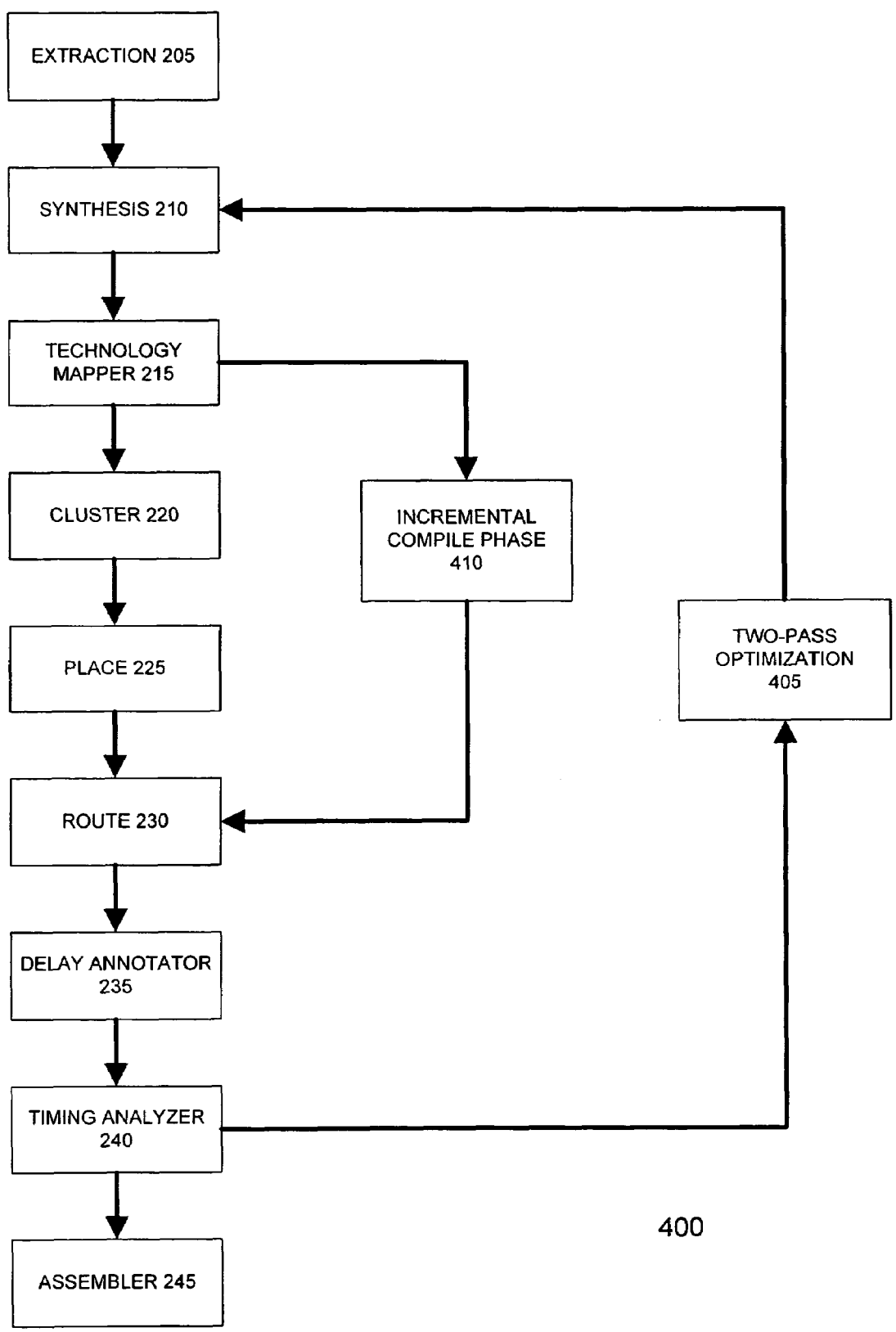
FIG. 4 illustrates a two-pass optimization in a compilation process according to an embodiment of the invention.

FIG. 4 illustrates a two-pass optimization in a compilation process 400 according to an embodiment of the invention. The compilation process 400 includes extraction 205, synthesis 210, technology mapper 215, cluster 220, place 225, route 230, delay annotator 235, timing analyzer 240, and assembler 245 phases, as discussed above. The place phase 225 saves the placement of atoms for future use with incremental compile flow, discussed in detail below. In this embodiment, the user design is initially processed by the extraction 205, synthesis 210, technology mapper 215, cluster 220, place 225, route 230, delay annotator 235 and timing analyzer 240 phases.

Following timing analyzer phase 240, the user design is optimized by the two-pass optimization phase 405. As discussed above, the two-pass optimization phase 405 utilizes the results of the timing analyzer phase 240 to identify timing-critical signal paths in the user design. For atoms on timing-critical paths, the two pass optimization phase 405 resynthesizes these atoms to optimize for maximum operating speed. For atoms on a non-critical signal paths, the two pass optimization phase 405 resynthesizes the atoms to minimize the area required to implement the user design. For example, the two pass optimization phase 405 duplicates atoms on timing-critical paths, which minimizes routing delays, and combines or eliminates atoms on non-critical paths, which improves area.

After the two-pass optimization phase, the optimized user design is processed again by the synthesis phase 210 and the technology mapper phase 215. However, instead of processing the optimized user design with the cluster 220 and place phases 225, the optimized design is processed with the incremental compile phase 410. Incremental compile phase 410 operates in a similar manner to the incremental compile phase 320 discussed in compilation process 300. The incremental compile phase 410 matches atoms of the unoptimized user design with corresponding atoms in the optimized user design. Using the placement information for the unoptimized user design previously stored by place phase 225, the incremental compile phase 410 places matching atoms of the optimized user design in the same locations as previously determined by the place phase 225. The incremental compile phase 410 then places the newly-added atoms of the optimized user design within the remaining portion of the programmable device.

Following the incremental compile phase 410, the optimized user design is processed by the route 230, delay annotator 235, timing analyzer 240, and assembler phases 245. This embodiment bypasses the cluster 220 and place 225 phases to compile the optimized user design, instead relying upon the incremental compile phase 410 to determine the placement of atoms in the optimized user design. Thus, the combination of the two pass optimization phase 405 with an incremental compile phase 410 results in substantially less time to compile and optimize the user design.

Figure 5:
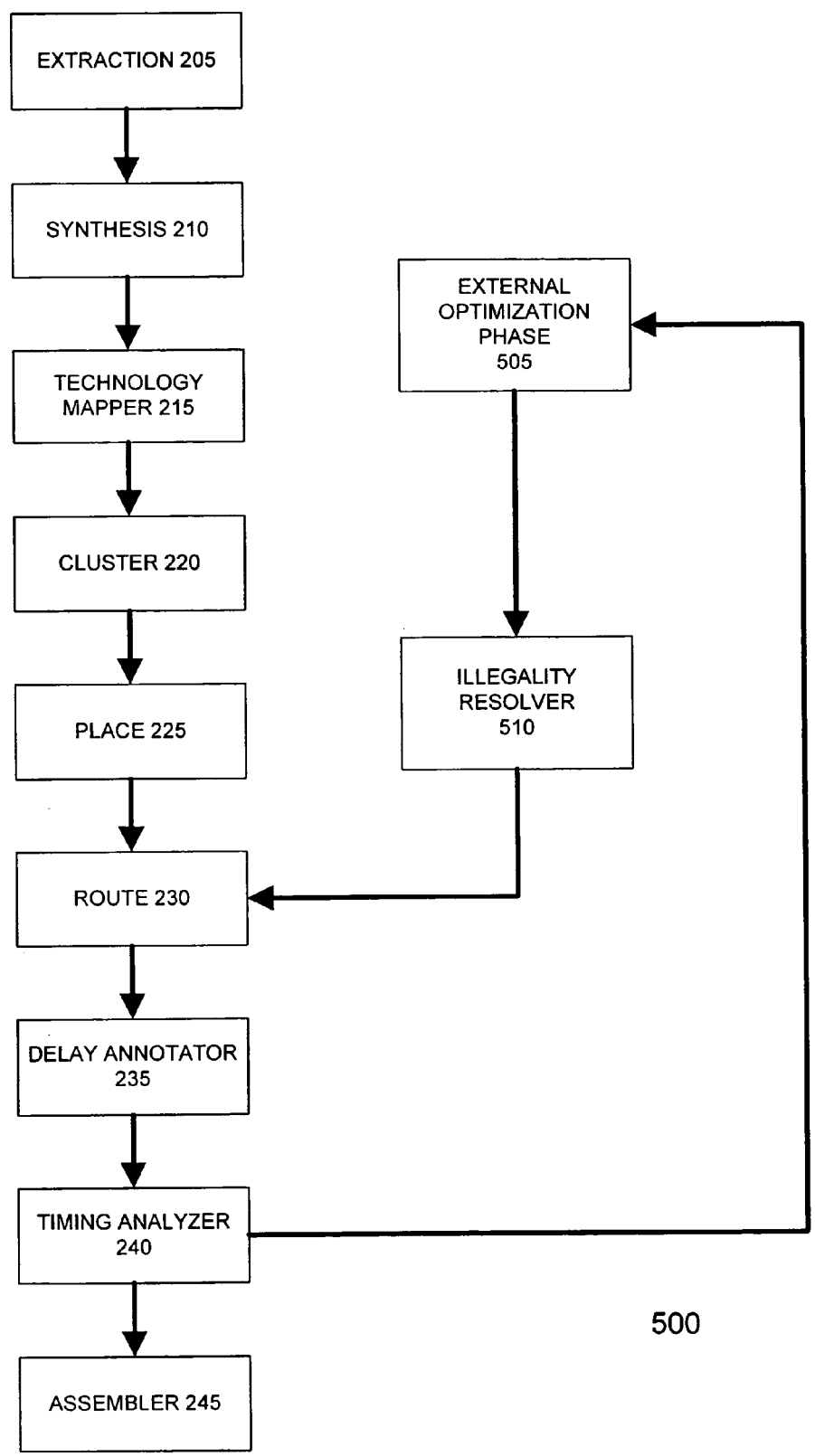
FIG. 5 illustrates a compilation process integrating an external optimization phase according to an embodiment of the invention.

FIG. 5 illustrates a compilation process 500 integrating an external optimization phase according to an embodiment of the invention. The external optimization phase can perform any type of optimization technique to the user design, for example physical synthesis optimization. The compilation process 400 includes extraction 205, synthesis 210, technology mapper 215, cluster 220, place 225, route 230, delay annotator 235, timing analyzer 240, and assembler 245 phases, as discussed above.

Following the timing analyzer phase 240, the user design is optimized by the external optimization phase 505. Typically, external optimization phases perform their own place phase on the user design following optimization. However, because the external optimization phase may not have accurate or detailed information on the underlying architecture of the programmable device, the placement information determined by an external optimization phase may include illegalities, including illegal placement of atoms and/or illegal routing connections. To remove illegalities, compilation process 500 applies illegality resolver phase 510 following the external optimization phase 505. Similar to the illegality resolver phase discussed above, the illegality resolver phase 510 modifies the placement of atoms of the optimized user design to remove any illegalities. Following the illegality resolver phase 510, the compilation process applies the route phase 230 to the optimized user design to determine a new and legal routing configuration. After determining a new routing configuration, the optimized user design is processed by delay annotator 235, timing analyzer 240, and assembler 245 phases.

Figure 6:
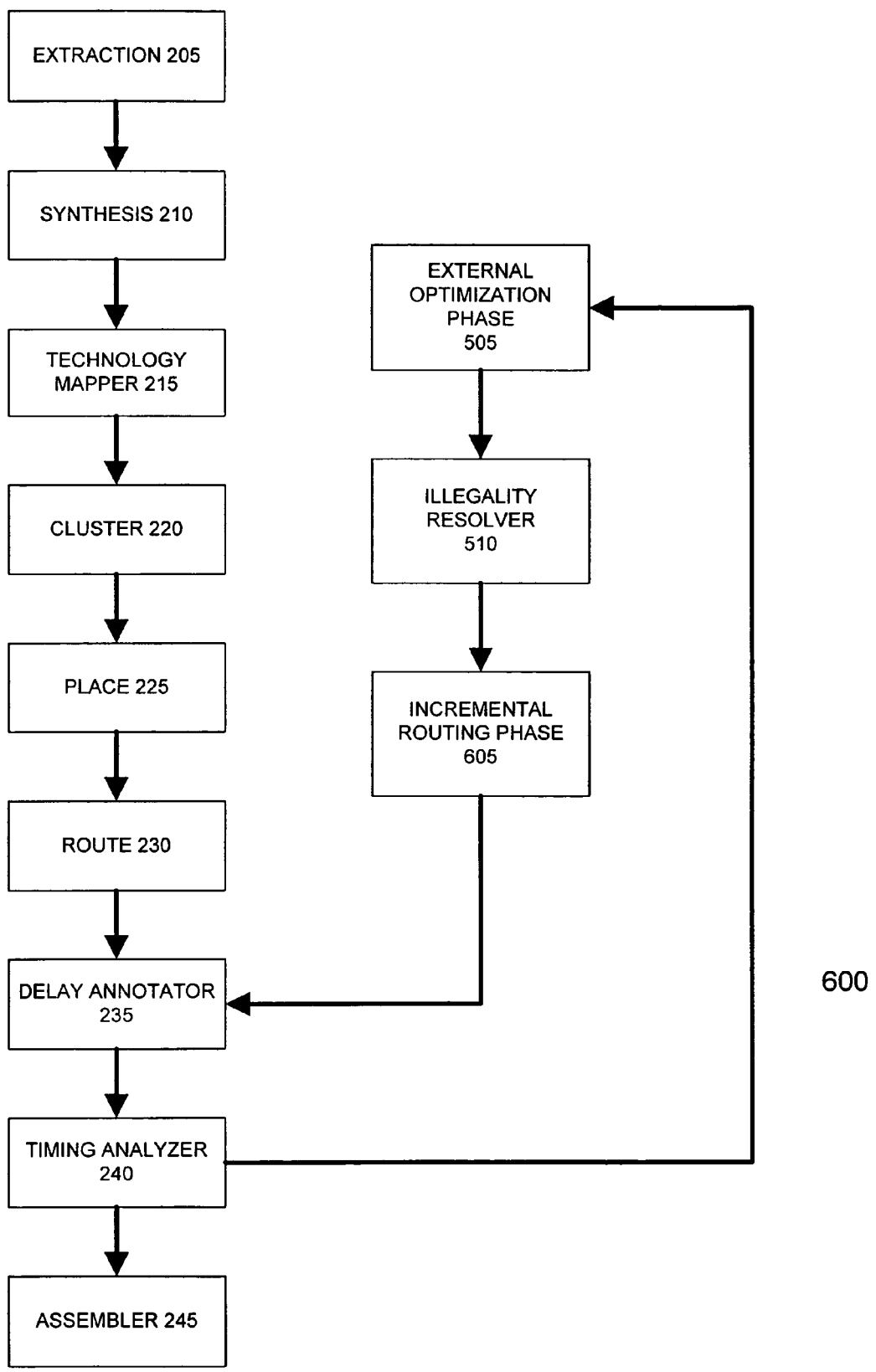
FIG. 6 illustrates a compilation process integrating an external optimization phase according to an embodiment of the invention.

FIG. 6 illustrates a compilation process 600 integrating an external optimization phase according to an embodiment of the invention. Like compilation process 500, compilation process 600 includes extraction 205, synthesis 210, technology mapper 215, cluster 220, place 225, route 230, delay annotator 235, timing analyzer 240, and assembler 245, external optimization 505, and illegality resolver 510 phases, as discussed above.

In this embodiment, following the removal of illegalities from the optimized user design using the illegality resolver 510, an incremental routing phase 605 determines the routing of connections in the optimized user design. Rather than regenerating an entire routing configuration anew, the incremental routing phase 605 matches atoms and their corresponding connections from the unoptimized design with atoms in the optimized design. For sets of atoms in the optimized user design corresponding with sets of atoms in the unoptimized design, the incremental routing phase 605 retains the associated routing configuration previously determined for the unoptimized design. After determining the placement and routing of atoms matching the initial user design, the incremental route phase routes connections for the added atoms using the unused connections of the configurable switching circuit. Thus, in this embodiment, the routing configuration only needs to be generated for portions of the user design changed by the external optimization phase. After determining a new routing configuration, the optimized user design is processed by delay annotator 235, timing analyzer 240, and assembler 245 phases.

Figure 7:
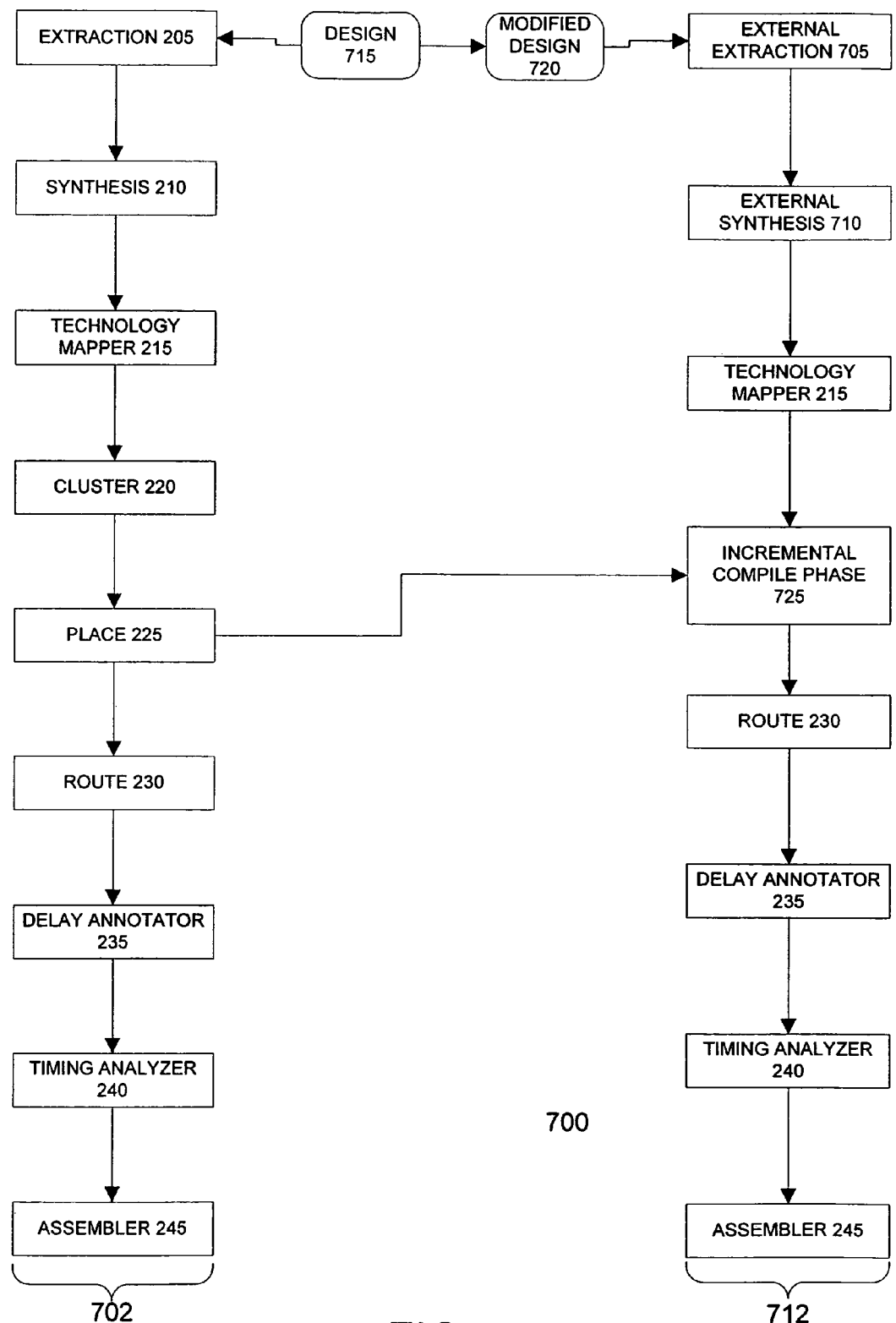
FIG. 7 illustrates an improved compilation process suitable for compiling modified user designs according to an embodiment of the invention.

FIG. 7 illustrates an improved compilation process 700 suitable for compiling modified user designs according to an embodiment of the invention. Occasionally, designers will want to use external extraction and synthesis applications to process a modified form of a user design, for example to evaluate the effectiveness of the external applications. The embodiment of compilation process 700 allows designers to employ external extraction and synthesis phases to a modified user design 720 while reducing the time needed to compile the modified user design. Compilation process 700 is similar to compilation process 300 and includes extraction 205, synthesis 210, technology mapper 215, cluster 220, place 225, route 230, delay annotator 235, timing analyzer 240, and assembler 245 phases, as discussed above. However, in processing the modified user design 720, the extraction 205 and synthesis 210 phases are replaced by external extraction 705 and external synthesis 710 phases. The external extraction 705 and external synthesis 710 phases can perform any type of extraction and synthesis techniques to the modified user design.

The compilation flow 702 processes the original user design 715. Similar to compilation flow 302, the placement of atoms of the original user design 715 are saved from place phase 225 and used to reduce the compilation time for the optimized user design 720. Following the external extraction 705, external synthesis 710, and technology mapper 215 phases in the compilation flow 712, the modified user design 720 is processed by incremental compile phase 725. Incremental compile phase 725 operates in a similar manner to the incremental compile phase 320 discussed above, with placement information from the original user design 715 being reused for unchanged portions of the modified user design 720. The changed portions of the modified user design 720 are placed in the remaining portion of the programmable device. Because the placement of atoms in the modified user design 720 does not have to be completely regenerated, the compilation flow 712 typically requires substantially less time to complete than other compilation processes that apply a place phase on the entire user design.

Figure 8:
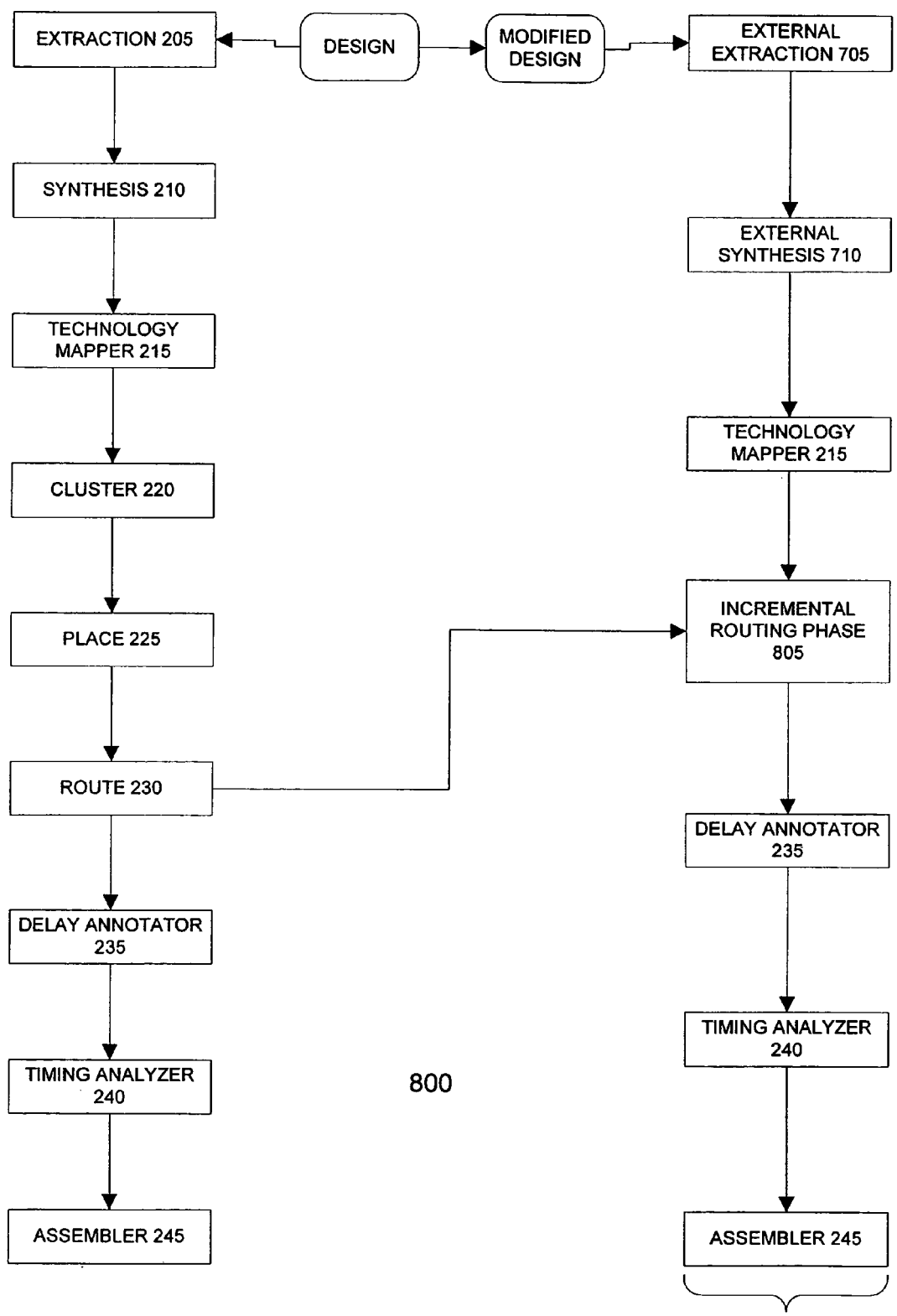
FIG. 8 illustrates an improved compilation process suitable for compiling modified user designs according to an embodiment of the invention.

FIG. 8 illustrates an improved compilation process 800 suitable for compiling modified user designs according to an embodiment of the invention. Compilation process 800 is similar to compilation process 700 and includes extraction 205, synthesis 210, technology mapper 215, cluster 220, place 225, route 230, delay annotator 235, timing analyzer 240, assembler 245, external extraction 705 and external synthesis 710 phases, as discussed above. However, an incremental routing phase 805 determines the routing configuration of a modified user design using the previously determined routing configuration of the original user design.

Similar to incremental routing phase 605, incremental routing phase 805 matches atoms and their corresponding connections from the original user design with atoms in the modified user design. For sets of atoms in the modified user design corresponding with sets of atoms in the original design, the incremental routing phase 805 retains the associated routing configuration previously determined for the original design. After determining the routing of atoms matching the initial user design, the incremental route phase routes connections for the added atoms using the unused connections of the configurable switching circuit. Because the incremental routing phase 805 does not need to regenerate an entire routing configuration anew, the compilation flow 812 for processing the modified user design typically requires substantially less time to complete than other compilation processes that apply a route phase on the entire user design.

Figure 9:
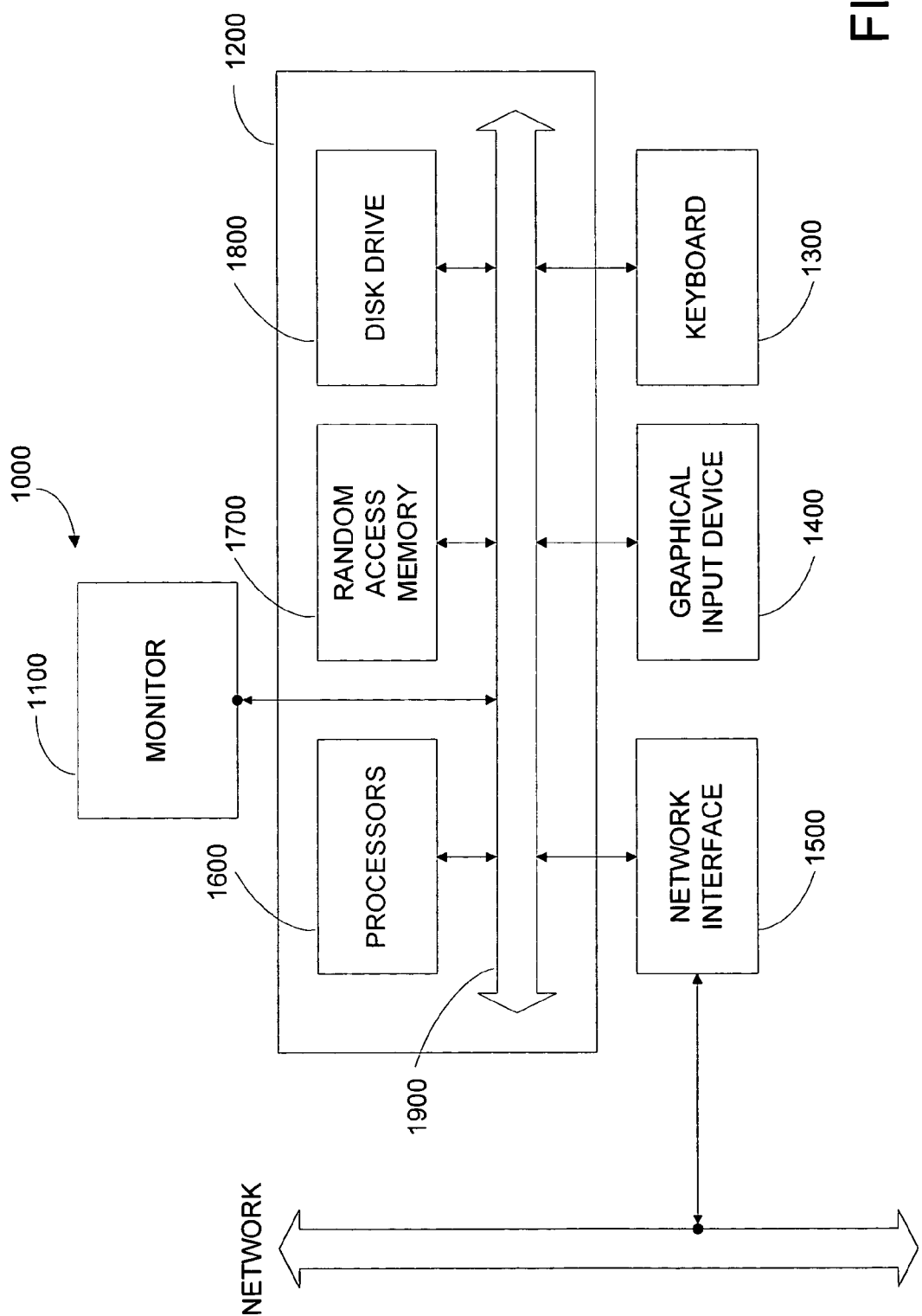
FIG. 9 illustrates an example computer system capable of implementing an embodiment of the invention.

FIG. 9 illustrates an example computer system 1000 capable of implementing an embodiment of the invention. Computer system 1000 typically includes a monitor 1100, computer 1200, a keyboard 1300, a user input device 1400, and a network interface 1500. User input device 1400 includes a computer mouse, a trackball, a track pad, graphics tablet, touch screen, and/or other wired or wireless input devices that allow a user to create or select graphics, objects, icons, and/or text appearing on the monitor 1100. Embodiments of network interface 1500 typically provides wired or wireless communication with an electronic communications network, such as a local area network, a wide area network, for example the Internet, and/or virtual networks, for example a virtual private network (VPN).

Computer 1200 typically includes components such as one or more general purpose processors 1600, and memory storage devices, such as a random access memory (RAM) 1700, disk drives 1800, and system bus 1900 interconnecting the above components. RAM 1700 and disk drive 1800 are examples of tangible media for storage of data, audio/video files, computer programs, applet interpreters or compilers, virtual machines, and embodiments of the herein described invention. Further embodiments of computer 1200 can include specialized input, output, and communications subsystems for configuring, operating, testing, and communicating with programmable devices. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

Further embodiments can be envisioned to one of ordinary skill in the art after reading the attached documents. For example, although the invention has been discussed with reference to programmable devices, it is equally applicable to logic minimization applications used to design any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method of determining a configuration of a programmable device, the method comprising:
    applying an extraction phase and a synthesis phase to a modified version of a user design;
    applying a technology mapper phase to the modified version of the user design;
    applying an incremental processing phase to the modified version of the user design, wherein the incremental processing phase is adapted to apply a set of configuration information previously determined for a previous version of the user design to a corresponding portion of the modified version of the user design; and
    applying an illegality resolver phase after applying the incremental processing phase, the illegality resolver phase configured to detect and remove illegalities in the modified version of the user design;
    wherein the extraction phase and the synthesis phase are performed by an external software application.

2. The method of claim 1, wherein the incremental processing phase is further adapted to generate a new set of configuration information for a non-corresponding portion of the modified version of the user design.

3. The method of claim 2, wherein the incremental processing phase includes an incremental compile phase adapted to apply a set of placement information previously determined for a previous version of the user design to a corresponding portion of the modified version of the user design and to generate a new set of placement information for a non-corresponding portion of the modified version of the user design.

4. The method of claim 2, wherein the incremental processing phase includes an incremental routing phase adapted to apply a set of routing information previously determined for a previous version of the user design to a corresponding portion of the modified version of the user design and to generate a new set of routing information for a non-corresponding portion of the modified version of the user design.

5. A method of determining a configuration of a programmable device, the method comprising:
    applying an extraction phase, a synthesis phase, a technology mapper phase, and a placement phase to a modified version of a user design; and
    applying an optimization phase to the modified version of the user design, wherein the optimization phase adapted to apply a selected one of a plurality of optimization algorithms to the modified version of the user design, the selected one of the plurality of optimization algorithms determined from a previous evaluation of the plurality of optimization algorithms applied to a previous version of the user design, wherein the optimization phase includes a physical synthesis optimization phase in which multiple restructuring algorithms are executed to add new atoms or to duplicate existing atoms in locations on the programmable device to minimize signal delay.

6. The method of claim 5, wherein the optimization phase is adapted to maximize an operating speed of the user design on the programmable device.

7. The method of claim 5, wherein the optimization phase is adapted to minimize an area requirement of the user design on the programmable device.

8. The method of claim 5, wherein the previous evaluation of the plurality of optimization algorithms applied to a previous version of the user design includes applying each of the plurality of optimization algorithms to the previous version of the user design and selecting one of the plurality of optimization algorithms providing the most improved performance of the previous version of the user design.

9. The method of claim 5, wherein the placement phase includes an incremental compilation phase adapted to apply a set of placement information previously determined for a previous version of the user design to a corresponding portion of the modified version of the user design and to generate a new set of placement information for a non-corresponding portion of the modified version of the user design.

10. The method of claim 5, wherein the step of applying an optimization phase to the modified version of the user design comprises a two-pass optimization phase comprising steps of:
   resynthesizing a first subset of existing atoms on timing-critical signal paths for maximum operating speed; and
   resynthesizing a second subset of existing atoms on non-critical signal paths to minimize an area required to implement the user design.

11. The method of claim 10, wherein the resynthesizing a first subset of existing atoms on timing-critical signal paths comprises duplicating atoms on the timing critical signal paths in order to minimize signal routing delays.

12. The method of claim 10, wherein the resynthesizing a second subset of existing atoms on non-critical signal paths comprises combining or eliminating atoms on the non-critical signal paths to minimize the area required to implement the user design.

13. A method of determining a configuration of a programmable device, the method comprising:
   applying a first set of compilation phases to a user design, wherein the first set of compilation phases includes an extraction phase, a synthesis phase, a technology mapper phase, a placement phase, a routing phase, a delay annotation phase, and a timing analyzer phase;
   applying an optimization phase to the user design to create an optimized user design;
   applying a second set of compilation phases to the optimized user design, wherein and the second set of compilation phases includes a synthesis phase, and a technology mapper phase; and
   applying an incremental processing phase to the optimized user design, wherein the incremental processing phase is adapted to apply a set of configuration information previously determined in the first set of compilation phases to a corresponding portion of the optimized user design.

14. The method of claim 13, wherein the incremental processing phase is further adapted to generate a new set of configuration information for a non-corresponding portion of the optimized user design.

15. The method of claim 14, wherein the incremental processing phase includes an incremental compile phase adapted to apply a set of placement information previously determined for the user design to the corresponding portion of the optimized user design and to generate a new set of placement information for the non-corresponding portion of the optimized user design.

16. The method of claim 14, wherein the incremental processing phase includes an incremental routing phase adapted to apply a set of routing information previously determined for the user design to the corresponding portion of the optimized user design and to generate a new set of routing information for the non-corresponding portion of the optimized user design.

17. The method of claim 13, wherein the second set of compilation phases is a subset of the first set of compilation phases.

18. The method of claim 13, wherein the optimization phase includes a two-pass optimization phase.

19. The method of claim 13, wherein the optimization phase is performed by an external software application.

20. The method of claim 19, further comprising applying an illegality resolver phase adapted to detect and remove illegalities in the optimized user design.

21. An information storage medium including a plurality of instructions adapted to direct an information processing device to perform a set of steps, the set of steps comprising:
   applying an extraction phase and a synthesis phase to a modified version of a user design;
   applying a technology mapper phase to the modified version of the user design;
   applying an incremental processing phase to the modified version of the user design, wherein the incremental processing phase is adapted to apply a set of configuration information previously determined for a previous version of the user design to a corresponding portion of the modified version of the user design; and
   applying an illegality resolver phase after applying the incremental processing phase, the illegality resolver phase configured to detect and remove illegalities in the modified user design;
   wherein the extraction phase and the synthesis phase are performed by an external software application.

22. The information storage medium of claim 21, wherein the incremental processing phase is further adapted to generate a new set of configuration information for a non-corresponding portion of the modified version of the user design.

23. The information storage medium of claim 22, wherein the incremental processing phase includes an incremental compile phase adapted to apply a set of placement information previously determined for a previous version of the user design to a corresponding portion of the modified version of the user design and to generate a new set of placement information for a non-corresponding portion of the modified version of the user design.

24. The information storage medium of claim 22, wherein the incremental processing phase includes an incremental routing phase adapted to apply a set of routing information previously determined for a previous version of the user design to a corresponding portion of the modified version of the user design and to generate a new set of routing information for a non-corresponding portion of the modified version of the user design.

25. A information storage medium including a plurality of instructions adapted to direct an information processing device to perform a set of steps, the set of steps comprising:
   applying an extraction phase, a synthesis phase, a technology mapper phase, and a placement phase to a modified version of a user design; and
   applying an optimization phase to the modified version of the user design, wherein the optimization phase adapted to apply a selected one of a plurality of optimization algorithms to the modified version of the user design, the selected one of the plurality of optimization algorithms determined from a previous evaluation of the plurality of optimization algorithms applied to a previous version of the user design wherein the optimization phase includes a physical synthesis optimization phase in which multiple restructuring algorithms are executed to add new atoms or to duplicate existing atoms in locations on the programmable device to minimize signal delay.

26. The information storage medium of claim 25, wherein the optimization phase is adapted to maximize an operating speed of the user design on a programmable device.

27. The information storage medium of claim 25, wherein the optimization phase is adapted to minimize an area requirement of the user design on a programmable device.

28. The information storage medium of claim 25, wherein the previous evaluation of the plurality of optimization algorithms applied to a previous version of the user design includes applying each of the plurality of optimization algorithms to the previous version of the user design and selecting one of the plurality of optimization algorithms providing the most improved performance of the previous version of the user design.

29. The information storage medium of claim 25, wherein the placement phase includes an incremental compilation phase adapted to apply a set of placement information previously determined for a previous version of the user design to a corresponding portion of the modified version of the user design and to generate a new set of placement information for a non-corresponding portion of the modified version of the user design.

30. A information storage medium including a plurality of instructions adapted to direct an information processing device to perform a set of steps, the set of steps comprising:
   applying a first set of compilation phases to a user design, wherein the first set of compilation phases includes an extraction phase, a synthesis phase, a technology mapper phase, a placement phase, a routing phase, a delay annotation phase, and a timing analyzer phase;
   applying an optimization phase to the user design to create an optimized user design;
   applying a second set of compilation phases to the optimized user design, and wherein the second set of compilation phases includes a synthesis phase, and a technology mapper phase; and
   applying an incremental processing phase to the optimized user design, wherein the incremental processing phase is adapted to apply a set of configuration information previously determined in the first set of compilation phases to a corresponding portion of the optimized user design.

31. The information storage medium of claim 30, wherein the incremental processing phase is further adapted to generate a new set of configuration information for a non-corresponding portion of the optimized user design.

32. The information storage medium of claim 31, wherein the incremental processing phase includes an incremental compile phase adapted to apply a set of placement information previously determined for the user design to the corresponding portion of the optimized user design and to generate a new set of placement information for the non-corresponding portion of the optimized user design.

33. The information storage medium of claim 31, wherein the incremental processing phase includes an incremental routing phase adapted to apply a set of routing information previously determined for the user design to the corresponding portion of the optimized user design and to generate a new set of routing information for the non-corresponding portion of the optimized user design.

34. The information storage medium of claim 30, wherein the second set of compilation phases is a subset of the first set of compilation phases.

35. The information storage medium of claim 30, wherein the optimization phase includes a two-pass optimization phase.

36. The information storage medium of claim 30, wherein the optimization phase is performed by an external software application.

37. The information storage medium of claim 36, further comprising a applying an illegality resolver phase adapted to detect and remove illegalities in the optimized user design.

* * * * *